US010855009B2

(12) United States Patent
Choi et al.

(10) Patent No.: US 10,855,009 B2
(45) Date of Patent: Dec. 1, 2020

(54) PRESS-FIT PIN, SEMICONDUCTOR PACKAGE HAVING THE SAME AND METHOD FOR MANUFACTURING THE PRESS-FIT PIN

(71) Applicant: JMJ Korea Co., Ltd., Bucheon-si (KR)

(72) Inventors: Yun Hwa Choi, Bucheon-si (KR); Soon Seong Choi, Gunpo-si (KR); Jeong Hun Cho, Goyang-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 16/563,957

(22) Filed: Sep. 9, 2019

(65) Prior Publication Data
US 2020/0185845 A1     Jun. 11, 2020

(30) Foreign Application Priority Data

Dec. 7, 2018     (KR) .................. 10-2018-0157600

(51) Int. Cl.
*H01R 43/16*     (2006.01)
*H01R 12/58*     (2011.01)
(Continued)

(52) U.S. Cl.
CPC ..... *H01R 12/585* (2013.01); *H01L 23/49555* (2013.01); *H01L 23/49811* (2013.01); *H01R 12/7064* (2013.01)

(58) Field of Classification Search
CPC .............. H01R 12/585; H01R 12/7064; H01L 23/49811; H01L 23/49555
See application file for complete search history.

(56) References Cited

U.S. PATENT DOCUMENTS 4,908,942 A * 3/1990 Long ................ H01R 43/16
                                                        29/882
6,764,318 B1 * 7/2004 Fajardo .............. H01R 12/585
                                                         439/108
(Continued)

FOREIGN PATENT DOCUMENTS

JP     2006-054116 A     2/2006
JP     2007-265641 A     10/2007
(Continued)

*Primary Examiner* — Truc T Nguyen
(74) *Attorney, Agent, or Firm* — Park, Kim & Suh, LLC

(57) ABSTRACT

Provided is a press-fit pin. The press-fit pin according to an embodiment of the present invention includes: a press unit press-fitted into a through hole formed on a board, which is press-fitted into an inner surface of the board including the through hole, pressurized toward a long hole formed inside the press unit, applies a repulsive force to the inner surface of the board through an elastic force, and maintains a contact with the inner surface of the board; a first terminal which is extended for a predetermined length from one side of the press unit along a longitudinal direction of the press unit and is disposed at the upper side of the board when press fitting the press unit; and a second terminal which is extended for a predetermined length from the other side of the press unit along the longitudinal direction of the press unit and is disposed at the lower side of the board, when press fitting the press unit, wherein the press unit includes a plurality of press-fit parts which faces each other along a width direction of the press unit based on the long hole, is pressurized to the inside along the width direction of the press unit and a thickness direction of the press unit, which crosses the width direction of the press unit, when the plurality of press-fit parts is press-fitted into the through hole, and applies a repulsive force toward the width direction of the press unit and the thickness direction of the press unit using an elastic force.

13 Claims, 10 Drawing Sheets

(51) Int. Cl.
  *H01R 12/70*    (2011.01)
  *H01L 23/498*    (2006.01)
  *H01L 23/495*    (2006.01)

(56) References Cited

U.S. PATENT DOCUMENTS

| | | | |
|---|---|---|---|
| 2005/0239345 A1* | 10/2005 | Furuno | H01R 12/585 |
| | | | 439/751 |
| 2006/0264076 A1* | 11/2006 | Chen | H01R 12/585 |
| | | | 439/82 |
| 2017/0346202 A1* | 11/2017 | Goto | H01R 13/2457 |
| 2018/0138610 A1* | 5/2018 | Goto | H01R 43/16 |
| 2018/0205163 A1* | 7/2018 | Sorig | H01R 12/585 |
| 2019/0074613 A1* | 3/2019 | Ochi | H01R 12/585 |
| 2019/0131723 A1* | 5/2019 | Txarola | H01R 12/585 |
| 2019/0199022 A1* | 6/2019 | Masuda | H01R 12/57 |

FOREIGN PATENT DOCUMENTS

| | | |
|---|---|---|
| JP | 2008-544450 A | 12/2008 |
| JP | 2015-156401 A | 8/2015 |
| JP | 2016-100320 A | 5/2016 |
| JP | 2017-216078 A | 12/2017 |
| KR | 10-2018-0016959 A | 2/2008 |
| KR | 10-2015-0095860 A | 8/2015 |
| KR | 10-1942812 B1 | 1/2019 |

\* cited by examiner

FIG. 2A
FIG. 2B
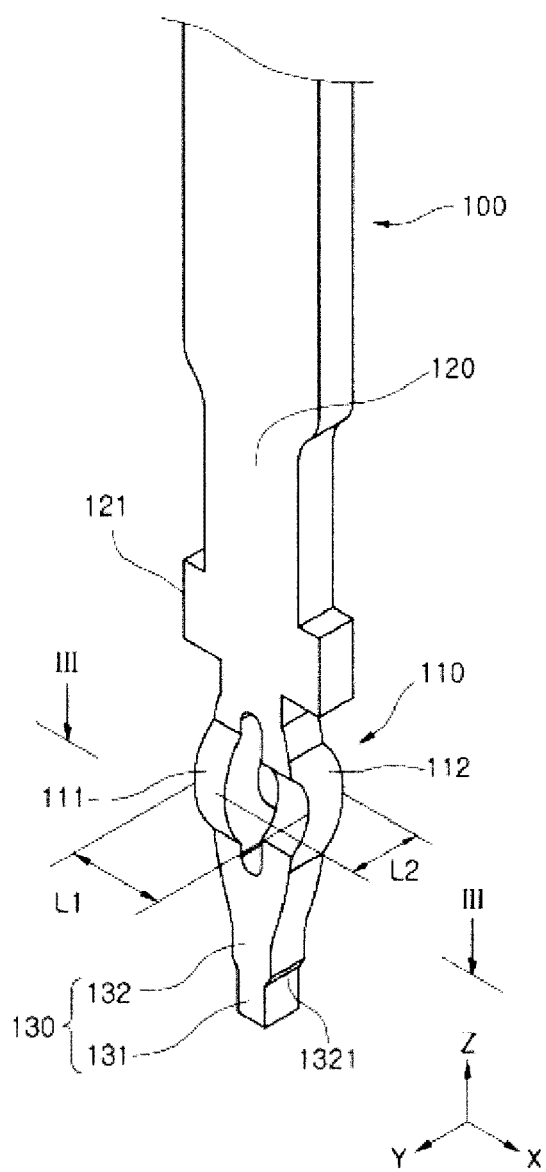
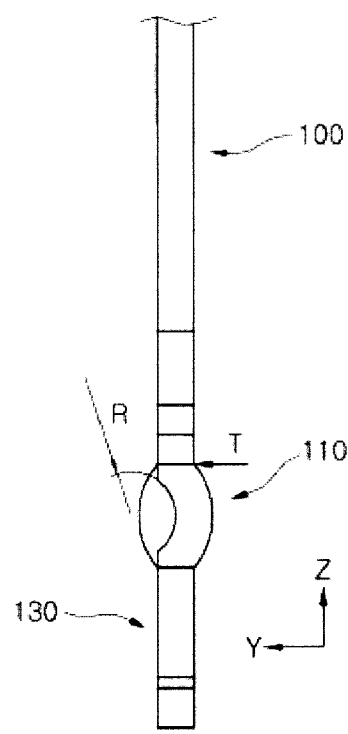

PRESS-FIT PIN, SEMICONDUCTOR PACKAGE HAVING THE SAME AND METHOD FOR MANUFACTURING THE PRESS-FIT PIN

CROSS-REFERENCE TO RELATED PATENT APPLICATION

This application claims the benefit of Korean Patent Application No. 10-2018-0157600, filed on Dec. 7, 2018, in the Korean Intellectual Property Office, the disclosure of which is incorporated herein in its entirety by reference.

BACKGROUND OF THE INVENTION

1. Field of the Invention

The present invention relates to a press-fit pin, a semiconductor package including the same, and a method of manufacturing the press-fit pin, and more particularly, to a press-fit pin which is press-fitted into a through hole formed on a board and is electrically contacted with the board, a semiconductor package including the press-fit pin, and a method of manufacturing the press-fit pin.

2. Description of the Related Art

In a general semiconductor package, a lead frame of the semiconductor package is closely adhered to a board and is installed to the board after soldering an adhered part.

However, in the above process, a probability of producing defects in a connected part may be high due to melting of solder and environmental pollution may cause due to a solder content.

Accordingly, a press-fit pin is conventionally developed for a semiconductor package to be stably installed to a board without using soldering.

The press-fit pin is formed to have an elastic force applied to an inner surface of a board when the press-fit pin is inserted into a through hole so that the press-fit pin is stably fixed to a through hole and provides an electric path between a semiconductor chip and the board.

In the press-fit pin, it is important to uniformly apply a repulsive force to an inner surface of a board, while the press-fit pin is press-fitted into a through hole, and thus to constantly maintain a contact between the press-fit pin and the board.

Accordingly, the press-fit pin including an outer part and an inner part is conventionally developed, wherein the outer part is contacted with an inner surface of a board including a through hole and the inner part is included in the outer part to elastically support the outer part.

Such a conventional press-fit pin minimizes a change of the outer part using the inner part, improves elasticity of the outer part, and prevents the press-fit pin from being twisted when press-fitting the press-fit pin.

However, in the conventional press-fit pin, a thickness of the outer part is thin to facilitate press-fitting and thereby, the inner part is additionally included within the outer part for elastically supporting the outer part. Accordingly, press-fitting is easily performed, however, the press-fit pin may not be stably fixed to the board. Thus, if a vibration or an outside force is applied, the press-fit pin may be easily detached from the board.

In addition, since the conventional press-fit pin has a complicated structure and thus, a special process such as drawing is required, a manufacturing process is complicated and thereby, productivity is decreased. Also, since a thick material may not be used and thus, a thin material is used to manufacture the press-fit pin, high resistance may be generated when a current with a high voltage is applied.

SUMMARY OF THE INVENTION

The present invention provides a press-fit pin, a semiconductor package including the press-fit pin, and a method of manufacturing the press-fit pin, wherein the press-fit pin may be tightly fixed to a board so that a connection between the press-fit pin and the board is stable even if a vibration or an outside force is applied, may minimize resistance for a current to smoothly flow, and may have a simple structure to significantly lower a probability of producing defects while manufacturing and to improve productivity.

According to an aspect of the present invention, there is provided a press-fit pin including: a press unit press-fitted into a through hole formed on a board, which is press-fitted into an inner surface of the board comprising the through hole, pressurized toward a long hole formed inside the press unit, applies a repulsive force to the inner surface of the board through an elastic force, and maintains a contact with the inner surface of the board; a first terminal which is extended for a predetermined length from one side of the press unit along a longitudinal direction of the press unit and is disposed at the upper side of the board when press fitting the press unit; and a second terminal which is extended for a predetermined length from the other side of the press unit along the longitudinal direction of the press unit and is disposed at the lower side of the board, when press fitting the press unit, wherein the press unit includes a plurality of press-fit parts which faces each other along a width direction of the press unit based on the long hole, is pressurized to the inside along the width direction of the press unit and a thickness direction of the press unit, which crosses the width direction of the press unit, when the plurality of press-fit parts is press-fitted into the through hole, and applies a repulsive force toward the width direction of the press unit and the thickness direction of the press unit using an elastic force.

The plurality of press-fit parts may be bent along the longitudinal direction of the press unit from the first terminal toward the second terminal in a circular form having a predetermined radius of curvature and the circular form bent parts may be projected in each different direction along the thickness direction of the press unit so that repulsive forces may be applied to the inner surface of the board from each different position when the plurality of press-fit parts is press-fitted into the through hole.

An outer surface of the plurality of press-fit parts facing each other along the width direction of the press unit may be curved along the longitudinal direction of the press unit from the first terminal toward the second terminal so that repulsive forces may be applied to the inner surface of the board from each different position when the plurality of press-fit parts is press-fitted into the through hole.

The plurality of press-fit parts may include a first press-fit part and a second press-fit part, the first press-fit part may apply repulsive forces to the inner surface of the board from one side of the through hole to one side of the width direction of the press unit and to one side of the thickness direction of the press unit, when the plurality of press-fit parts is press-fitted into the through hole, and the second press-fit part may apply repulsive forces to the inner surface of the board from the other side of the through hole to the other side of the width direction of the press unit and to the other side of the thickness direction of the press unit, when the plurality of press-fit parts is press-fitted into the through hole.

Lengths in the width direction and the thickness direction of the press unit press-fitted into the through hole may be the same as a diameter of the through hole or larger than the diameter of the through hole, the length in the width direction of the press unit may be formed to be 1 to 1.5 times larger than the diameter of the through hole, and the length in the thickness direction of the press unit may be formed to be 1 to 1.2 times larger than the diameter of the through hole.

The press unit may include a thickness of 0.2 to 0.8 times larger than the diameter of the through hole and a radius of curvature of 0.3 to 0.8 times larger than the diameter of the through hole.

The plurality of press-fit parts may be formed to line-contact or surface-contact with the inner surface of the board and a surface contacted with the inner surface of the board may be rounded or chamfered.

The first terminal may further include a shoulder unit for restricting a length of the press unit inserted into the through hole when the press unit is press-fitted into the through hole.

The second terminal may include: an insertion unit which is to be inserted into other element; and a connection unit which is extended from the press unit to connect the insertion unit with the press unit and includes a stepped unit at the end part thereof, wherein when the insertion unit is inserted into other element, the stepped unit is supported by one side of the other element and restricts an insertion length of the insertion unit.

According to another aspect of the present invention, there is provided a semiconductor package including the press-fit pin above.

According to another aspect of the present invention, there is provided a method of manufacturing a press-fit pin including: blanking a material and forming an outward form of a press-fit pin comprising a press unit, a first terminal, and a second terminal, wherein the press unit comprises a first press-fit part and a second press-fit part which are both curved along a longitudinal direction, the first terminal extends from one side of the press unit, and the second terminal extends from the other side of the press unit; placing one side of the press unit at an upper side of a groove depressed by a predetermined depth by using a bending device while one side of the first terminal and one side of the second terminal are supported by the bending device, pressurizing the other side of the first press-fit part by using a pressurizing means of the bending device comprising a circular-form pressurizing projection, and bending the first press-fit part in a circular form; turning the outward form upside down to place the other side of the press unit at the upper side of the groove while the other side of the first terminal and the other side of the second terminal are supported by the bending device, pressurizing one side of the second press-fit part by using the pressurizing means, and bending the second press-fit part in a circular form.

According to the embodiment of the present invention, the plurality of press-fit parts may be bent and curved in a circular form having a predetermined radius of curvature along a longitudinal direction of the press unit from the first terminal toward the second terminal. Thus, when the plurality of press-fit parts is pressurized into the through hole, the repulsive forces may be simultaneously applied to the inner surface of the board from a plurality of positions along the thickness direction of the press unit and the width direction of the press unit. Therefore, the press-fit pin may be tightly fixed to the board so that a connection between the press-fit pin and the board may be stable even if a vibration or an outside force is applied.

Also, resistance is minimized through the bent parts having a circular form and a current smoothly flows so that a probability of generating an error in a chip included in a semiconductor package may be significantly reduced. Also, the board or other elements may be prevented from being damaged due to heat.

In addition, the press-fit pin may have a simple structure to significantly lower a probability of producing defects while manufacturing and to improve productivity. Accordingly, the cost of manufacturing may be reduced.

BRIEF DESCRIPTION OF THE DRAWINGS

The above and other features and advantages of the present invention will become more apparent by describing in detail exemplary embodiments thereof with reference to the attached drawings in which:

FIGS. 2A and 2B are perspective views of a press-fit pin according to an embodiment of the present invention;

DETAILED DESCRIPTION OF THE INVENTION

Figure 1:
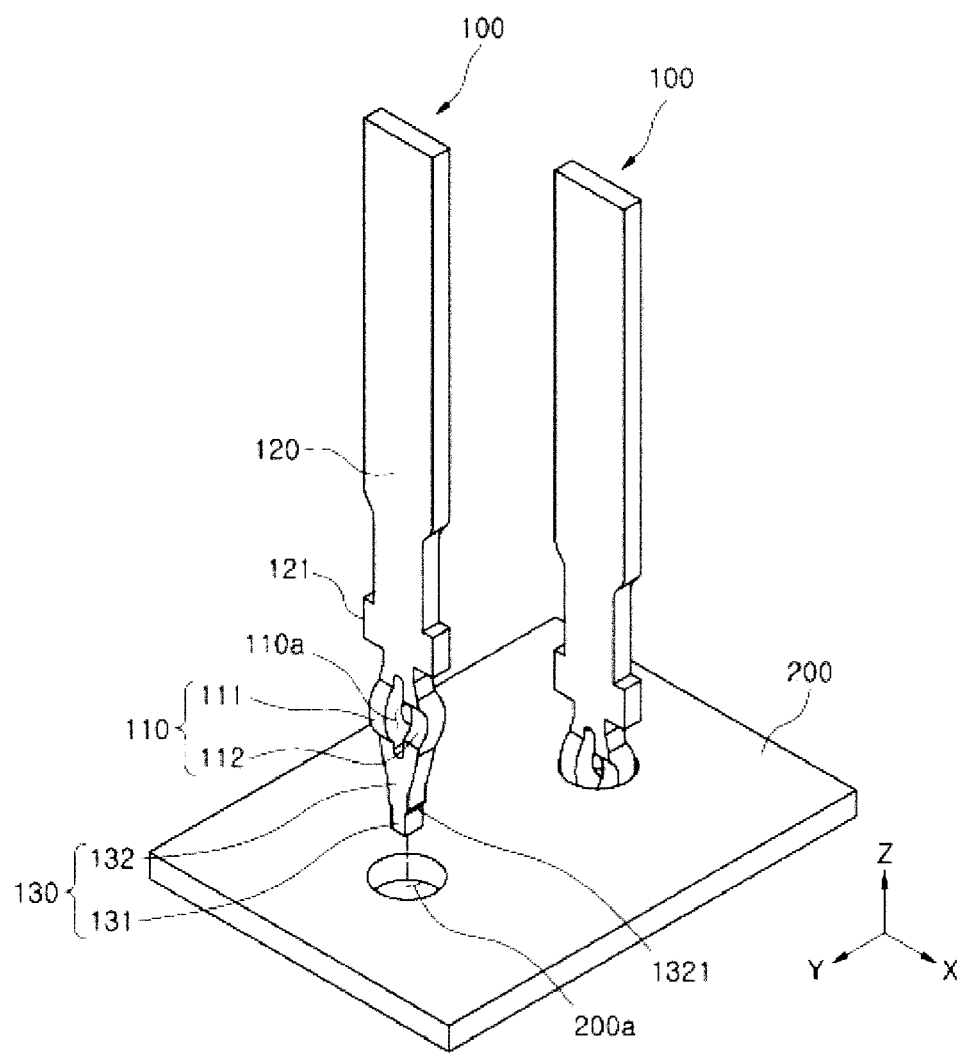
FIG. 1 is a perspective view illustrating that a press-fit pin according to an embodiment of the present invention is combined to and spaced apart from a board.

Hereinafter, various exemplary embodiments will now be described more fully with reference to the accompanying drawings. The embodiments may be embodied in many different forms. Particular embodiments may be illustrated in the drawings and described in more detail in the detailed description of the invention. However, the particular embodiments illustrated in the accompanying drawings are merely representative for purposes of describing various exemplary embodiments. Accordingly, it should be understood, however, that there is no intent to limit exemplary embodiments to the particular forms disclosed, but on the contrary, exemplary embodiments are to cover all modifications, equivalents, and alternatives falling within the scope of the invention.

It will be understood that, although the terms first, second, etc. may be used herein to describe various elements, these elements should not be limited by these terms. These terms are only used to distinguish one element from another.

Also, It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that when an element or layer is referred to as being "formed on," another element or layer, it can be directly or indirectly formed on the other element or layer. That is, for exemplary, intervening elements or layers may be present. In contrast, when an element or layer is referred to as being "directly formed on," to another element, there are no intervening elements or layers present.

The elements used herein such as "module" or "unit" performs a least one function or operation. Also, the "module" or "unit" may function or operate by hardware, software, or combinations of hardware and software. In addition, except for a "module" or a "unit" to be operated in specific hardware or at least one processor, a plurality of "modules" or a plurality of "units" may be combined as one module. As used herein, the singular forms are intended to include the plural forms as well, unless the context clearly indicates otherwise.

In addition, in the description, the detailed descriptions of well-known technologies and structures may be condensed or omitted so as not to hinder the understanding of the present invention.

Figure 3:
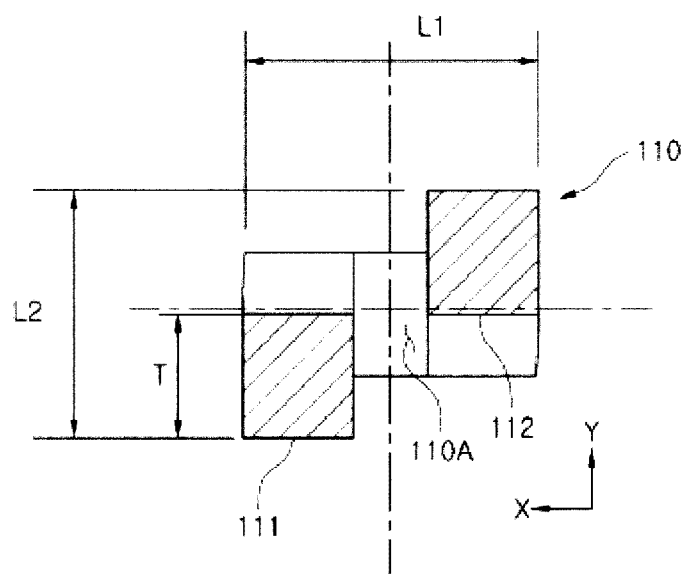
FIG. 3 is a cross-sectional view of the press-fit pin of FIGS. 2A and 2B cut along a line III-III of FIGS. 2A and 2B.
Figure 4:
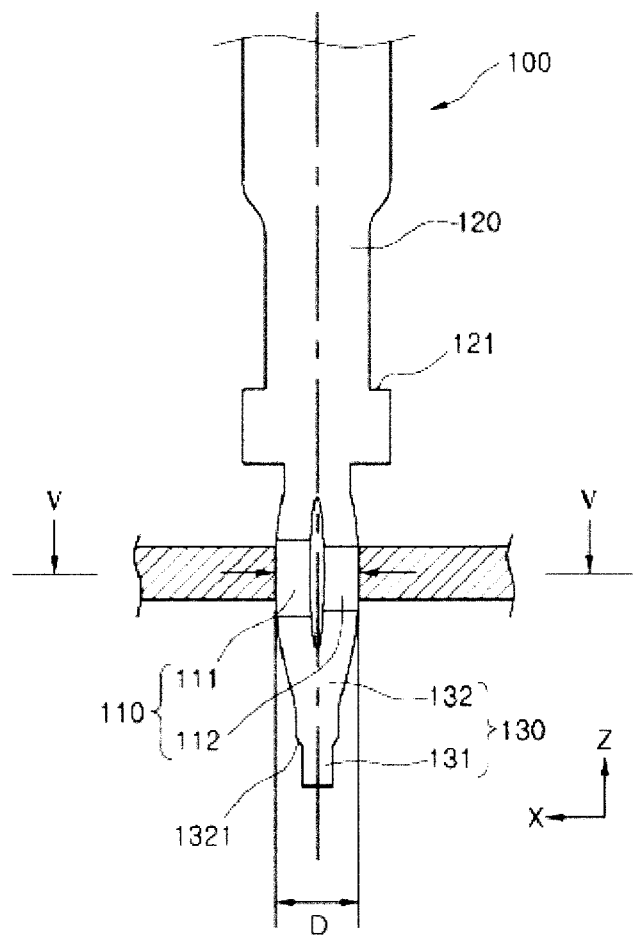
FIG. 4 is a front view schematically illustrating a press-fit pin according to an embodiment of the present invention combined to a board.
Figure 5:
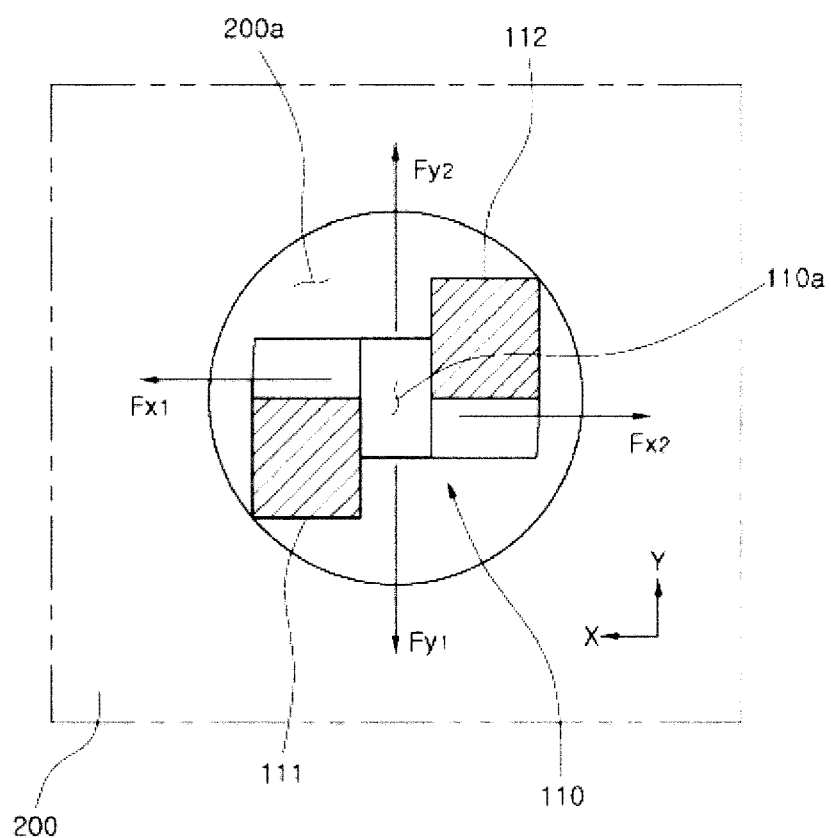
FIG. 5 is a cross-sectional view of the press-fit pin of FIG. 4 cut along a line V-V of FIG. 4.
Figure 6A:
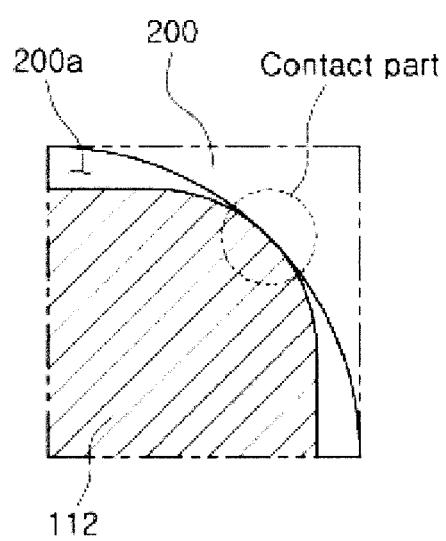
FIGS. 6A and 6B are enlarged views view of a contact part formed by a press-fit part of a press-fit pin according to an embodiment of the present invention and an inner surface of a board.
Figure 6B:
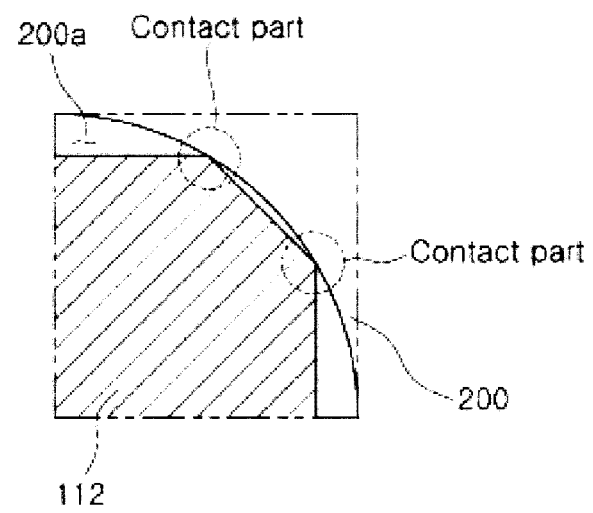

FIG. 1 is a perspective view illustrating that a press-fit pin 100 according to an embodiment of the present invention is combined to and spaced apart from a board 200, FIGS. 2A and 2B are perspective views of the press-fit pin 100 according to an embodiment of the present invention, FIG. 3 is a cross-sectional view of the press-fit pin 100 of FIGS. 2A and 2B cut along a line III-III of FIGS. 2A and 2B, FIG. 4 is a front view schematically illustrating the press-fit pin 100 according to an embodiment of the present invention combined to the board 200, FIG. 5 is a cross-sectional view of the press-fit pin 100 of FIG. 4 cut along a line V-V of FIG. 4, and FIGS. 6A and 6B are enlarged views of a contact part formed by a press-fit part of the press-fit pin 100 according to an embodiment of the present invention and an inner surface of the board 200.

Referring to FIGS. 1, 2A and 2B, the press-fit pin 100 according to an embodiment of the present invention includes a lead frame (not illustrated) included in a semiconductor package (not illustrate) or is a part of a lead frame so that the press-fit pin 100 may be press-fitted into a through hole 200a formed on the board 200 and thereby, physically combined to the board 200. Also, the press-fit pin 100 may be electrically contact with the board 200. For example, the press-fit pin 100 may be formed of a conductive metal. Here, the board 200 is a printed circuit board and an inner circumferential surface of the through hole 200a, where the press-fit pin 100 is press-fitted, may be plated with a metal such as tin, copper, or gold due to improvement of electric property.

The press-fit pin 100 includes a press unit 110.

The press unit 110 is interposed between a first terminal 120 and a second terminal 130, which will be described below. When the press-fit pin 100 is connected to the board 200, the press-fit pin 100 is press-fitted into the through hole 200a formed on the board 200 and is fixed to the board 200 by an elastic force.

Here, when the press unit 110 is press-fitted into the through hole 200a, the press unit 110 fixes to the board 200 using an elastic force.

More specifically, the press unit 110 includes a long hole 110a and a plurality of press-fit parts, wherein the plurality of press-fit parts is pressurized toward the long hole 110a and applies a repulsive force toward a width direction (X-axis direction) and a thickness direction (Y-axis direction) using an elastic force when the press unit 110 is press-fitted into the through hole 200a.

Referring to FIGS. 2A, 2B and 4, the plurality of press-fit parts faces each other along the width direction (X-axis direction) of the press unit 110 based on the long hole 110a. Also, referring to FIGS. 3 and 5, when the plurality of press-fit parts is press-fitted into the through hole 200a, the plurality of press-fit parts is pressurized to the inside along the width direction (X-axis direction) of the press unit 110 and the thickness direction (Y-axis direction) of the press unit 110, which crosses the width direction of the press unit 110, and applies a repulsive force toward the width direction (X-axis direction) of the press unit 110 and the thickness direction (Y-axis direction) of the press unit 110 using an elastic force.

Accordingly, as illustrated in FIGS. 4 and 5, when the press unit 110 is press-fitted into the through hole 200a, the press unit 110 is press-fitted into the inner surface of the board 200 including the through hole 200a through the plurality of press-fit parts and is pressurized toward the long hole 110a formed inside the press unit 110. Also, the press unit 110 applies a repulsive force to the inner surface of the board 200 through an elastic force so that a contact between the press unit 110 and the inner surface of the board 200 may maintain and the press unit 110 may be stably combined to the board 200.

The plurality of press-fit parts included in the press unit 110 may have a bent structure in a circular form.

Referring to FIGS. 1, 2A and 2B, the plurality of press-fit parts may be bent along a longitudinal direction (Z-axis direction) of the press unit 110 from the first terminal 120 toward the second terminal 130 and may be in a circular form having a predetermined radius of curvature.

More specifically, the plurality of press-fit parts extended straight along the longitudinal direction (Z-axis direction) of the press unit 110 may be partly bent in a circular form having a predetermined radius of curvature.

Here, a bent part having a circular form respectively formed on the plurality of press-fit parts may be projected in each different direction along the thickness direction (Y-axis direction) of the press unit 110.

Accordingly, as illustrated in FIGS. 3 and 5, when the plurality of press-fit parts is press-fitted into the through hole 200a, the plurality of press-fit parts is pressurized to the inside along the thickness direction (Y-axis direction) of the press unit 110 and is elastically restored to the outside along the thickness direction (Y-axis direction) of the press unit 110 using an elastic force. Therefore, repulsive forces Fy1 and Fy2 may be applied to the inner surface of the board 200 from each different position.

However, the bent parts respectively formed on the plurality of press-fit parts are not restricted to have a circular form and may have various forms within the scope of the invention for realizing the same function.

Also, referring to FIGS. 2A, 2B and 4, the plurality of press-fit parts may be curved along the longitudinal direction (Z-axis direction) of the press unit 110 from the first terminal 120 toward the second terminal 130.

More specifically, external surfaces of each of the plurality of press-fit parts which face each other along the width direction (X-axis direction) of the press unit 110 and are extended along the longitudinal direction (Z-axis direction) of the press unit 110 may be curved from the first terminal 120 toward the second terminal 130.

Accordingly, as illustrated in FIGS. 4 and 5, when the plurality of press-fit parts is press-fitted into the through hole 200a, the plurality of press-fit parts is pressurized to the inside along the width direction (X-axis direction) of the press unit 110 and is elastically restored to the outside along the width direction (X-axis direction) of the press unit 110 using an elastic force. Therefore, repulsive forces Fx1 and Fx2 may be applied to the inner surface of the board 200 from each different position.

For example, referring to FIGS. 2A through 4, a length L1 in the width direction and a length L2 in the thickness direction of the press unit 110 press-fitted into the through hole 200a may be the same as a diameter D of the through hole 200a or may be larger than the diameter D of the through hole 200a. More specifically, the length L1 in the width direction of the press unit 110 may be formed to be 1 to 1.5 times larger than the diameter D of the through hole 200a. The L2 in the thickness direction of the press unit 110 may be formed to be 1 to 1.2 times larger than the diameter D of the through hole 200a. More preferably, without considering an error, the length L1 in the width direction of the press unit 110 may be formed to be 1.2 times larger than the diameter D of the through hole 200a and the L2 in the thickness direction of the press unit 110 may be formed to be the same as the diameter D of the through hole 200a. Also, a thickness T of the press unit 110 is formed to be 0.2 to 0.8 times larger than the diameter D of the through hole 200a, and the radius of curvature R of the bent part having a circular form is formed to be 0.3 to 0.8 times larger than the diameter D of the through hole 200a. More preferably, without considering an error, the thickness T of the press unit 110 is formed to be 0.5 times larger than the diameter D of the through hole 200a, and the radius of curvature R of the bent part having a circular form is formed to be 0.6 times larger than the diameter D of the through hole 200a. When the plurality of press-fit parts is pressurized, a width of the long hole 110a, which forms a predetermined space for the plurality of press-fit parts to be pressurized, is formed to be smaller than a width of each of the plurality of press-fit parts. A length of the long hole 110a is longer than the diameter D of the through hole 200a and shorter than a length of the press unit 110. However, the size of the press unit 110 is not limited thereto and may vary according to a material used to form the board 200, the size of the through hole 200a, and a material used to form the press-fit pin 100.

That is, as illustrated in FIG. 5, the plurality of press-fit parts is bent along the longitudinal direction (Z-axis direction) of the press unit 110 from the first terminal 120 toward the second terminal 130 and may be in a circular form having a predetermined radius of curvature. Also, the plurality of press-fit parts is curved along the longitudinal direction (Z-axis direction) of the press unit 110 from the first terminal 120 toward the second terminal 130. Accordingly, when the plurality of press-fit parts is pressurized into the through hole 200a, the repulsive forces Fx1, Fx2, Fy1, and Fy2 may be simultaneously applied to the inner surface of the board 200 from a plurality of positions along the thickness direction (Y-axis direction) of the press unit 110 and the width direction (X-axis direction) of the press unit 110. Thus, the press-fit pin 100 may be tightly fixed to the board 200 so that a connection between the press-fit pin 100 and the board 200 is stable even if a vibration or an outside force is applied. Also, resistance is minimized through the bent parts having a circular form and a current smoothly flows so that the board 200 may be prevented from being damaged due to heat. For example, when the press-fit pin 100 including the circular-form bent parts is connected in series to a diode with 1200 V and 75 A for a current to flow while a voltage is set to 700 mV and then, resistance is measured, the resistance of the press-fit pin 100 including the circular-form bent parts is 5.79Ω and a general press-fit pin without having circular-form bent parts is 6.29Ω. That is, the resistance of the press-fit pin 100 including the circular-form bent parts is about 8% lower than that of the conventional press-fit pin without having circular-form bent parts. Accordingly, a current may smoothly flow and a probability of generating an error in a chip included in a semiconductor package may be significantly reduced. Also, the board 200 or other elements may be prevented from being damaged due to heat.

Referring to FIGS. 2A, 2B, and 5, the plurality of press-fit parts may include a first press-fit part 111 and a second press-fit part 112.

In FIGS. 2A and 2B, the first press-fit part 111 is disposed at one side of the long hole 110a and a circular-form bent part thereof is projected forward. Accordingly, when the first press-fit part 111 is press-fitted into the through hole 200a, the repulsive forces Fx1 and Fy1 may be applied to the inner surface of the board 200 from one side of the through hole 200a to one side of the width direction (X-axis direction) of the press unit 110 and to one side of the thickness direction (Y-axis direction) of the press unit 110.

In FIGS. 2A and 2B, the second press-fit part 112 is disposed at the other side of the long hole 110a and a circular-form bent part thereof is projected backward. Accordingly, when the second press-fit part 112 is press-fitted into the through hole 200a, the repulsive forces Fx2 and Fy2 may be applied to the inner surface of the board 200 from the other side of the through hole 200a to the other side of the width direction (X-axis direction) of the press unit 110 and to the other side of the thickness direction (Y-axis direction) of the press unit 110.

In addition, when the first press-fit part 111 and the second press-fit part 112 are press-fitted into the through hole 200a, the first press-fit part 111 and the second press-fit part 112 may be formed to line-contact or surface-contact with the inner surface of the board 200.

More specifically, the plurality of press-fit parts press-fitted into the through hole 200a is rounded and thus, surface-contact with the inner surface of the board 200 may be available as shown in FIG. 6A. Also, the plurality of press-fit parts press-fitted into the through hole 200a is chamfered by a predetermined angle and thus, line-contact with the inner surface of the board 200 may be available from a plurality of positions as shown in FIG. 6B.

Accordingly, when the press-fit pin 100 is press-fitted into the through hole 200a, the press-fit pin 100 may secure a contact surface with the board 200 so that the weight of the press-fit pin 100 may be dispersed into the board 200 and thereby, the press-fit pin 100 may be stably supported to the inner surface of the board 200.

In addition, the press-fit pin 100 includes a plurality of terminals.

Referring to FIGS. 2A, 2B and 4, the plurality of terminals includes the first terminal 120 and the second terminal 130.

The first terminal 120 extends for a predetermined length from one side of the press unit 110 along the longitudinal direction (Z-axis direction) of the press unit 110 and is disposed at the upper side of the board 200, when press fitting the press unit 110 to the board 200. Also, the first terminal 120 is included in a semiconductor package (not illustrated) and is electrically connected with a chip (not illustrated) of the semiconductor package.

For example, the first terminal 120 may include a plurality of areas according to the width thereof. More specifically, the first terminal 120 may include a first area and a second area, wherein the first area has the largest width and included in a semiconductor package and the second area extends in a longitudinal direction from the first area, has a smaller width than that of the first area, and is larger than one side of the press unit 110.

When the press unit 110 is press-fitted into the through hole 200a, the first terminal 120 may further include a shoulder unit 121 which is used to restrict a length of the press unit 110 inserted into the through hole 200a.

The shoulder unit 121 is interposed between one side of the press unit 110 and the first terminal 120 and may extends for a predetermined length from the sides of the first terminal 120 along the width direction (X-axis direction) of the press unit 110. Here, the width of the shoulder unit 121 may be larger than the diameter D of the through hole 200a.

Accordingly, when the press unit 110 is press-fitted into the through hole 200a over a predetermined length, the end part of the shoulder unit 121 is supported by the upper surface of the board 200 including the through hole 200a and may restrict the length of the press unit 110 inserted into the through hole 200a.

The second terminal 130 extends for a predetermined length from the other side of the press unit 110 along the longitudinal direction (Z-axis direction) of the press unit 110 and is disposed at the lower side of the board 200, when press fitting the press unit 110 to the board 200. For example, the second terminal 130 exposed at the lower side of the board 200 may be combined to other element (not illustrated) included at the outside of the board 200.

Also, the second terminal 130 may have a width in which a cross-section thereof narrows from the other side of the press unit 110 toward the longitudinal direction (Z-axis direction) of the press unit 110. Accordingly, when the press-fit pin 100 is inserted into the through hole 200a of the board 200, the press-fit pin 100 may be prevented from being detached and the press unit 110 may be easily press-fitted.

Referring to FIG. 4, the second terminal 130 may include an insertion unit 131 and a connection unit 132, wherein the insertion unit 131 may be inserted into other element (not illustrated) and the connection unit 132 restricts an insertion length of the insertion unit 131.

The insertion unit 131 is projected by a predetermined length from the end of the connection unit 132 may have a projection having a circular or polygonal form.

The connection unit 132 extends from the press unit 110 and may connect the insertion unit 131 with the press unit 110. Also, the connection unit 132 may include a stepped unit 1321 at the end part thereof, wherein when the insertion unit 131 is inserted into other element included at the lower side of the board 200, the stepped unit 1321 is supported by one side of the other element and restricts an insertion length of the insertion unit 131.

That is, the press-fit pin 100 may determine a location for the press unit 110 to be press-fitted by using the shoulder unit 121 included in the first terminal 120 and the stepped unit 1321 of the connection unit 132 included in the second terminal 130 and accordingly, the press unit 110 may be prevented from being detached or unstably press-fitted into the through hole 200a.

In a semiconductor package (not illustrated) to which the press-fit pin 100 is applicable, the press-fit pin 100 may include a lead frame partly or as a whole, a semiconductor chip electrically connected to the lead frame, and a molding unit including the semiconductor chip and the lead frame.

For example, the semiconductor chip may be applicable as a power semiconductor chip such as a power MOSFET semiconductor used in a high voltage environment with high heat. The lead frame provides an electric path between the board 200 and the semiconductor chip, and the lead frame and the semiconductor chip may be directly connected to each other or indirectly connected using a medium such as a metal wire or a metal clip.

However, the semiconductor chip is not restricted thereto and may have various structures.

Hereinafter, a method of manufacturing the press-fit pin 100 according to an embodiment of the present invention will be described.

For convenience of description, each elements and reference numerals used to describe the method of manufacturing the press-fit pin 100 may be referred to the description of the press-fit pin 100 above and identical or overlapped description will be omitted.

Figure 7:
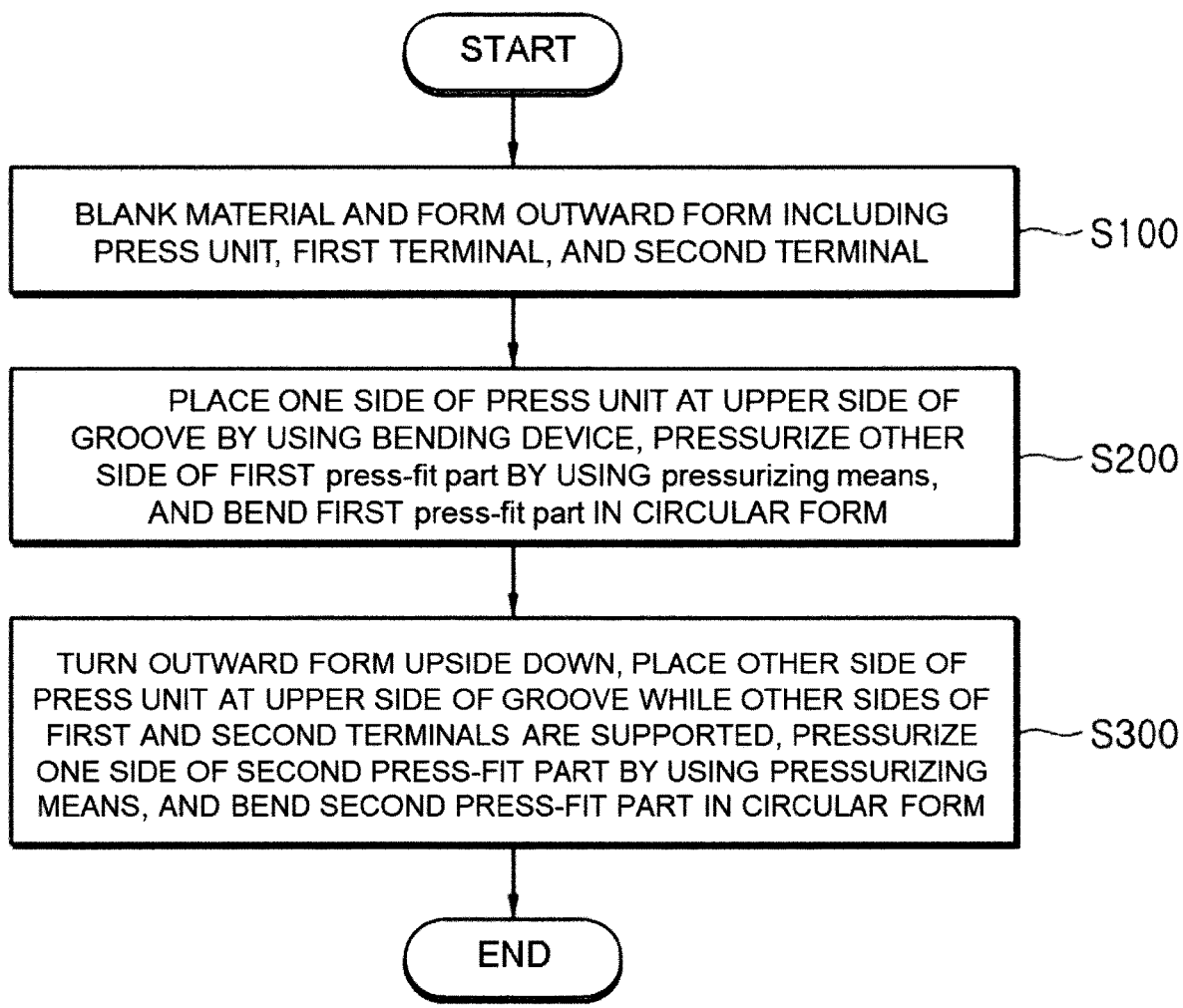
FIG. 7 is a flowchart illustrating a method of manufacturing a press-fit pin according to an embodiment of the present invention.
Figure 8:
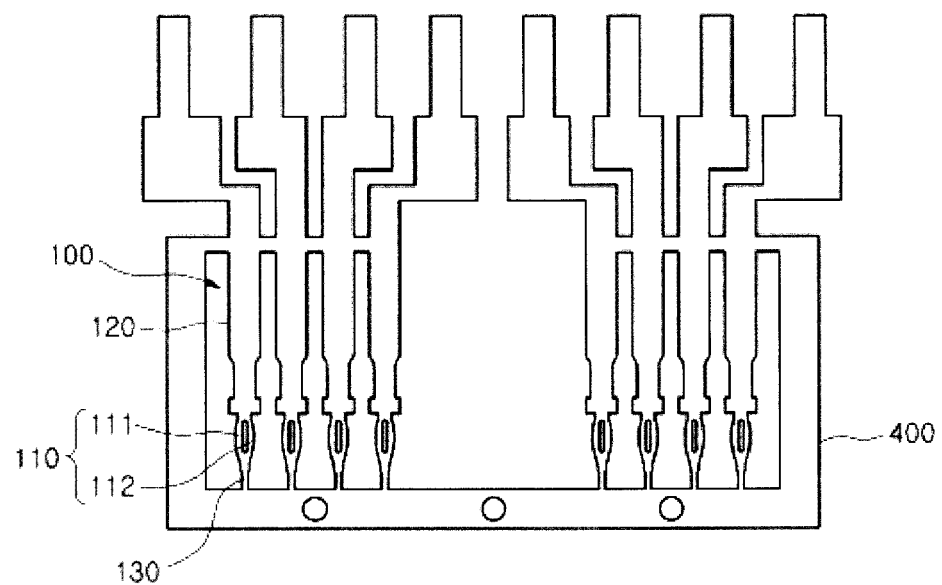
FIGS. 8 through 10 schematically illustrate the method of manufacturing a press-fit pin of FIG. 7.
Figure 9:
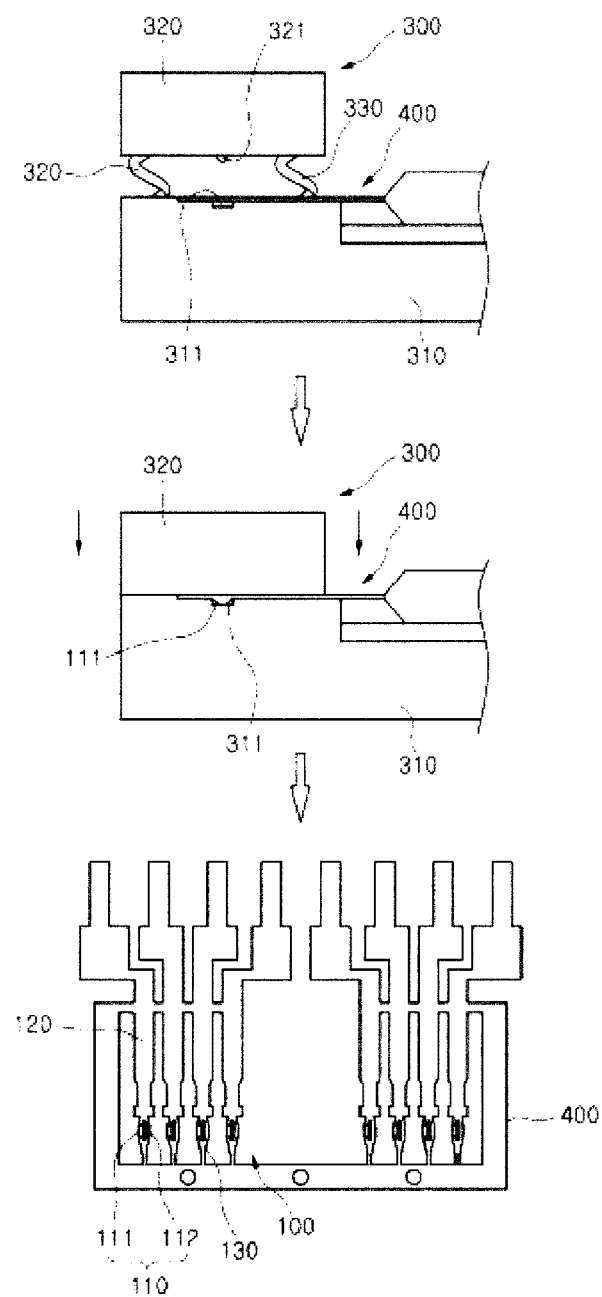
Figure 10:
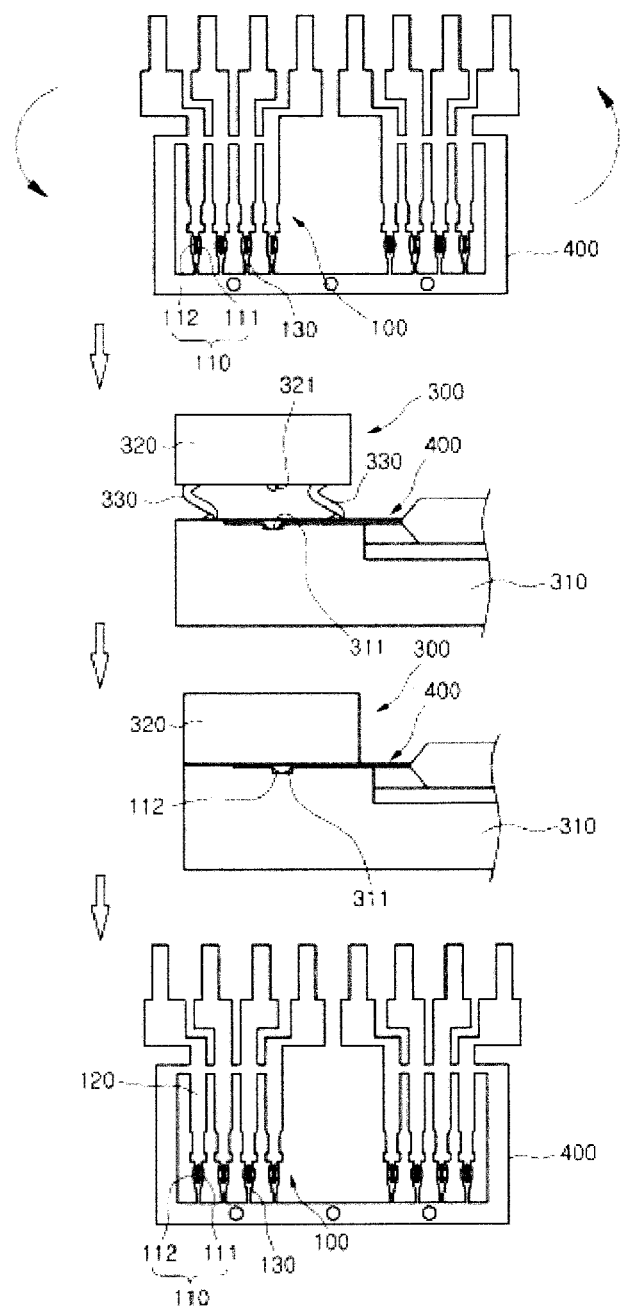

FIG. 7 is a flowchart illustrating a method of manufacturing the press-fit pin 100 according to an embodiment of the present invention and FIGS. 8 through 10 schematically illustrate the method of manufacturing the press-fit pin 100.

Referring to FIGS. 7 and 8, the method of manufacturing the press-fit pin 100 includes blanking a material and then forming an outward form of the press-fit pin 100 including the press unit 110, the first terminal 120, and the second terminal 130 in operation S100, wherein the press unit 110 includes the first press-fit part 111 and the second press-fit part 112 which are both curved along a longitudinal direction, the first terminal 120 extends from one side of the press unit 110, and the second terminal 130 extends from the other side of the press unit 110.

That is, in the method of manufacturing the press-fit pin 100, a metal material is blanked through a physical or chemical way and then, an outward form of the press-fit pin 100 is formed, wherein the press-fit pin 100 includes the press unit 110 including the first press-fit part 111 and the second press-fit part 112, the first terminal 120, and the second terminal 130. Here, the outward form of the press-fit pin 100 may be connected to a frame 400 as one body, wherein the frame 400 is formed using a material where various areas are blanked.

Next, referring to FIGS. 7 and 9, a bending device 300 is used to place one side of the press unit 110 at the upper side of a groove 311 depressed by a predetermined depth, while one side of the first terminal 120 and one side of the second terminal 130 are supported by the bending device 300, and a pressurizing means 320 of the bending device 300 including a circular-form pressurizing projection 321 is used to pressurize the other side of the first press-fit part 111 so that the first press-fit part 111 is bent in a circular form, in operation S200.

Then, referring to FIGS. 7 and 10, after the first press-fit part 111 is bent in a circular form, the outward form is turned upside down so that the other side of the press unit 110 is placed at the upper side of the groove 311 of the bending device 300, while the other side of the first terminal 120 and the other side of the second terminal are supported by the bending device 300, and the pressurizing means 320 of the bending device 300 is used to pressurize one side of the second press-fit part 112 so that the second press-fit part 112 is bent in a circular form, in operation S300.

Here, the bending device 300 may include a supporting means 310, the pressurizing means 320, and an elasticity supporting means 330.

The supporting means 310 fixes the material at a predetermined position of one side thereof and includes the groove 311 having a predetermined depth on one surface of the supporting means 310 so that the one surface of the material may be supported by the supporting means 310.

For example, one surface of the supporting means 310 is entirely formed to be a flat board and thereby, the supporting means 310 may support the outward form of the press-fit pin 100, wherein the press-fit pin 100 is not combined to a semiconductor package. Also, while the outward form of the press-fit pin 100 is combined to a semiconductor package, the supporting means 310 may be formed to be a stepped board, in which a predetermined section is depressed, so that one side thereof may support the semiconductor package and the other side thereof may support the outward of the press-fit pin 100. In addition, the supporting means 310 may include a fixing means to fix the frame 400 at a set position, wherein the frame 400 is formed using the material where the outward form of the press-fit pin 100 is connected as one body. The fixing means may have a stepped form to support the end of the material or a cylindrical form to be inserted into a joint hole formed on the frame 400.

The pressurizing means 320 is disposed at the upper side of the supporting means 310 and the circular-form pressurizing projection 321 may be formed on the other side of the pressurizing means 320 facing one side of the supporting means 310 on which the groove 311 is formed. Here, the pressurizing projection 321 may be formed on the other side of the pressurizing means 320 as one body or as a detachable module.

In the elasticity supporting means 330, one side thereof is included in the supporting means 310 and the other side thereof is included in the pressurizing means 320 and thus, the elasticity supporting means 330 may elastically support the pressurizing means 320. For example, the elasticity supporting means 330 may be a coil spring and a plurality of the elasticity supporting means 330 may be interposed between the supporting means 310 and the pressurizing means 320.

Accordingly, in the method of manufacturing the press-fit pin 100, while one side of the first press-fit part 111 and one side of the second press-fit part 112 are placed in the groove 311 of the supporting means 310, the frame 400 formed using the material where the outward form of the press-fit pin 100 is connected as one body is fixed to the supporting means 310 at a set position and the pressurizing means 320 is pressurized vertically for the circular-form pressurizing projection 321 to pressurize the other side of the first press-fit part 111. Thus, the first press-fit part 111 is bent in a circular form. Also, while the frame 400 formed using the material where the outward form of the press-fit pin 100 is connected as one body is turned upside down in a vertical direction and the other sides of the first press-fit part 111 and second press-fit part 112 are placed in the groove 311 of the supporting means 310, the frame 400 is fixed to the supporting means 310 at a set position and the pressurizing means 320 is pressurized vertically for the circular-form pressurizing projection 321 to pressurize one side of the second press-fit part 112. Thus, the second press-fit part 112 is bent in a circular form.

According to the embodiment of the present invention, the plurality of press-fit parts may be bent and curved in a circular form having a predetermined radius of curvature along a longitudinal direction of the press unit 110 from the first terminal 120 toward the second terminal 130. Thus, when the plurality of press-fit parts is pressurized into the through hole 200a, the repulsive forces may be simultaneously applied to the inner surface of the board 200 from a plurality of positions along the thickness direction of the press unit 110 and the width direction of the press unit 110.

Therefore, the press-fit pin 100 may be tightly fixed to the board 200 so that a connection between the press-fit pin 100 and the board 200 may be stable even if a vibration or an outside force is applied.

Also, resistance is minimized through the bent parts having a circular form and a current smoothly flows so that a probability of generating an error in a chip included in a semiconductor package may be significantly reduced. Also, the board 200 or other elements may be prevented from being damaged due to heat.

In addition, the press-fit pin 100 may have a simple structure to significantly lower a probability of producing defects while manufacturing and to improve productivity. Accordingly, the cost of manufacturing may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A press-fit pin comprising:
   a press unit press-fitted into a through hole formed on a board, wherein the press unit is pressurized toward a long hole formed inside the press unit, applies elastic forces to an inner surface of the through hole, and maintains a contact with the inner surface of the through hole;
   a first terminal which is extended for a predetermined length from one side of the press unit along a longitudinal direction of the press unit and is disposed at the upper side of the board when press fitting the press unit; and
   a second terminal which is extended for a predetermined length from the other side of the press unit along the longitudinal direction of the press unit and is disposed at the lower side of the board, when press fitting the press unit,
   wherein the press unit comprises first and second press-fit parts which face each other along a width direction of the press unit based on the long hole, each press-fit part being deformed in the width direction of the press unit and a thickness direction of the press unit, when press-fitted into the through hole, and applying elastic forces in the width direction and the thickness direction,
   wherein the first press-fit part is bent in the thickness direction to have a semicircular form having a predetermined radius of curvature and an outer side surface of the first press-fit part is curved in the width direction such that the first press-fit part is elastically deformed in the thickness and width directions when press-fitted into the through hole,
   wherein the second press-fit part is bent in the thickness direction to have a semicircular form having a predetermined radius of curvature and an outer side surface of the second press-fit part is curved in the width direction such that the second press-fit part is elastically deformed in the thickness and width directions when press-fitted into the through hole.

2. The press-fit pin of claim 1, wherein a width and a thickness of the press unit press-fitted into the through hole are the same as a diameter of the through hole or larger than the diameter of the through hole, the width of the press unit is 1 to 1.5 times larger than the diameter of the through hole, and the thickness of the press unit is 1 to 1.2 times larger than the diameter of the through hole.

3. The press-fit pin of claim 2, wherein the thickness of the press unit is 0.2 to 0.8 times larger than the diameter of the through hole and the radius of curvature is 0.3 to 0.8 times larger than the diameter of the through hole.

4. The press-fit pin of claim 1, wherein the first and second press-fit parts are formed to line-contact or surface-contact with the inner surface of the through hole and a surface contacted with the inner surface of the through hole is rounded or chamfered.

5. The press-fit pin of claim 1, wherein the first terminal further comprises a shoulder unit for restricting a length of the press unit inserted into the through hole when the press unit is press-fitted into the through hole.

6. The press-fit pin of claim 1, wherein the second terminal comprises:
   an insertion unit; and
   a connection unit which is extended from the press unit to connect the insertion unit with the press unit and includes a stepped unit at an end part thereof, wherein the stepped unit restricts an insertion length of the insertion unit.

7. A semiconductor package comprising a press-fit pin of claim 1.

8. A semiconductor package comprising a press-fit pin of claim 2.

9. A semiconductor package comprising a press-fit pin of claim 3.

10. A semiconductor package comprising a press-fit pin of claim 4.

11. A semiconductor package comprising a press-fit pin of claim 5.

12. A semiconductor package comprising a press-fit pin of claim 6.

13. The press-fit pin of claim 1, wherein the long hole is formed between the first and second press-fit parts and is extended to an upper portion of the connection unit such that the first and second press-fit parts are not in contact with each other when the press unit is press-fitted into the through hole.

* * * * *